United States Patent [19]
Yamada

[11] Patent Number: 5,933,793
[45] Date of Patent: Aug. 3, 1999

[54] OUTGOING HARMONIC LEVEL EVALUATOR

[75] Inventor: Naoya Yamada, Tokyo, Japan

[73] Assignee: Mitsubishi Electric Building Techno-Service Co., Ltd., Toyo, Japan

[21] Appl. No.: 08/883,708

[22] Filed: Jun. 27, 1997

[30] Foreign Application Priority Data

Jul. 2, 1996 [JP] Japan .................................. 8-172449

[51] Int. Cl.$^6$ .................................................. G01R 25/00
[52] U.S. Cl. .............................. 702/65; 702/64; 327/100; 327/119; 324/600; 324/623
[58] Field of Search ........................ 702/65, 64; 324/600, 324/623; 327/100, 119; 307/87, 105; 363/39; 361/113

[56] References Cited

U.S. PATENT DOCUMENTS

| | | | |
|---|---|---|---|
| 4,695,792 | 9/1987 | Roy ....................................... | 324/76.82 |
| 5,053,939 | 10/1991 | Kirchberg, Jr. et al. .................. | 363/41 |
| 5,138,267 | 8/1992 | Komagata et al. ...................... | 324/601 |
| 5,729,421 | 3/1998 | Gershen et al. ........................ | 361/113 |

OTHER PUBLICATIONS

Voltech Inc.; "Voltech, Inc. introduces the new, improved PM1000 Precision Power Analyzer"; News Release; Dateline: Ashland, MA, Jun. 1, 1989.

A. Cavallini, G.C. Montanari, M. Cacciari; "Stochastic Evaluation of Harmonis at Network Buses"; IEEE Transactions on Power Delivery; v. 10, n. 3 pp. 1606–1613, Jul. 1995.

J.G. Leckey, J.A.C. Stewart, and A.D. Patterson; "Analysis of HEMT Harmonic Generation using a Vector Nonlinear Measurement System"; IEEE MTT–S Digest; pp. 1739–1742, Jun. 1996.

James M. Moravek; Edward Lethert; "The k factor: clearing up its mystery"; EC&M Electrical Construction & Maintenance; v. 92 n. 6; p. 65(7), Jun. 1993.

C. Sankaran; "Effects of harmonics on power systems (part 2)"; EC&M Electrical Construction & Maintenance, v. 95 n. 2; p. 57(5), Feb. 1996.

*Primary Examiner*—James P. Trammell
*Assistant Examiner*—Demetra R. Smith
*Attorney, Agent, or Firm*—Sughrue, Mion, Zinn, Macpeak & Seas, PLLC

[57] ABSTRACT

An outgoing harmonic level evaluator which evaluates the amount of outgoing harmonics by computing correction to the amount of harmonics measured at a receiving point without the need for summing the measurement values of generated harmonics in load bus lines. The evaluator comprises a potential current transformer and a potential transformer arranged at the receiving point from the power supply bus line, respectively for measuring a load current and a load voltage, a harmonic order analyzing unit for determining a harmonic current and a harmonic voltage on an order by order basis based on a current signal and a voltage signal, respectively from the potential current transformer and the potential transformer, an incoming harmonic level correction computing unit for determining the corrected component of the incoming harmonic current based on the harmonic voltage and an impedance of a phase advancing capacitor block as a load, and a generated harmonic level evaluating unit for determining a true harmonic level generated from the group of loads through the vector subtraction process of the harmonic currents from the harmonic order analyzing unit and the incoming corrected component of the harmonic current from the incoming harmonic level correction computing unit.

2 Claims, 3 Drawing Sheets

OUTGOING HARMONIC LEVEL EVALUATOR

BACKGROUND OF THE INVENTION

1. Field of the Invention

The present invention relates to an outgoing harmonic level evaluator which computes and evaluates easily a harmonic current generated in a power consumer's facility such as a building and a plant.

2. Description of the Related Art

"Guidelines to the control of harmonics by consumers of high or special high voltage power supply" (issued by the Public Utilities Department, the Agency of Natural Resources and Energy, Japan's Ministry of International Trade and Industry, September 1994) requires that each consumer equipped with a harmonic current sourcing apparatus above an equivalent capacity 50 kVA and receiving a voltage of 6.6 kV at a receiving point control harmonic levels to not exceeding the upper limit of outgoing current per order of the harmonics on a per 1 kW contracted power basis as specified by the guidelines.

FIG. 3 is a skeleton diagram of a receiving and transformation unit in a building or plant regarded as a non-utility electric installation. Referring to FIG. 3, how the amount of generated harmonics is evaluated is shown.

As shown, actual measurements are made to determine whether the level of harmonics exceeds the outgoing current upper limit specified by the above quoted guidelines.

Shown in FIG. 3 are a terminal section 1 of a power cable that leads a three-phase, 50 Hz, 6.6 kV power into a power room in a building or other facility, a disconnector 2, a main circuit-breaker 3, and a potential transformer 4 and a potential current transformer 5 for conducting a voltage and a current at receiving points to respective measuring instruments.

FIG. 3 shows three lighting power systems and two motor driving power systems as feeder lines. Branched off from a load bus line are branch circuit-breakers 13, 23, 33, 43, and 53, to which current transformers 15, 25, 35, 45 and 55 are respectively connected. Transformers 16, 26, 36, 46 and 56 for the lighting power systems and motor driving power systems feed power to loads 17, 27, 37, 47 and 57, respectively.

Also shown in FIG. 3 are a branch circuit-breaker 93 and a current transformer 95 arranged in a phase advancing capacitor block and a vacuum electro-magnetic contactor 113 which engages or disengages a phase advancing capacitor 115 and a serial reactor 114 in or out of a 6.6 kV line. Also shown are vacuum electro-magnetic contactors 123, 133 and 143, serial reactors 124, 134, and 144 and phase advancing capacitors 125, 135, and 145. Using an unshown known automatic power factor regulator, the phase advancing capacitor block is operated to include a number of banks in its bus line required to set the power factor at power receiving points to almost 100%.

The measurements and diagnosis of the amount of generated harmonics in buildings or other facilities are typically made in busiest hours during which a maximum level of harmonics is likely to be generated by unspecified number of loads generating harmonics, for example, 17, 27, 37, 47 and 57 in FIG. 3.

The diagnosis is performed by computing equation (1) based on data obtained from an unshown known harmonic order analyzer that is connected to each of the secondary sides of the current transformers 15, 25, 35, 45 and 55.

$$|I_n|=|I_{n1}|+|I_{n2}|+\ldots+|I_{n5}| \quad (1)$$

where $I_n$ is a total amount of the harmonic currents generated up to an n-th order, and $I_{n1}$ through $I_{n5}$ are individual amounts of harmonic currents.

Whether an n-th harmonic current in each feeder line is a generated one (outgoing current) or an incoming current is determined by referring to the sign of the n-th harmonic power $P_n$ output from the unshown known harmonic order analyzer. Specifically, if the n-th harmonic power $P_n$ is negative, it is a harmonic generation (outgoing), and if the n-th harmonic power $P_n$ is positive, it is an incoming current.

Alternatively, if the phase angle of the n-th harmonic current $I_{nm}$ relative to the n-th harmonic voltage $V_n$ is greater than +90° or smaller than -90°, respectively, the harmonic power $P_n$ is an outgoing power, and if the phase angle of the n-th harmonic current $I_{nm}$ relative to the n-th harmonic voltage $V_n$ is within a range of ±90°, the harmonic power $P_n$ is an incoming power (suffixes m denote feeder lines 1, 2, . . . 5).

Since the phase advancing capacitor blocks 115, 125, 135, 145 are a linear circuit which typically draws in harmonics, the equation (1) for computing the generated harmonic current measured at the secondary side of the current transformer 95 fails to reflect the effect of the phase advancing capacitor blocks 115, 125, 135, and 145 in many cases.

In the prior art evaluator for the outgoing level of harmonic currents, however, harmonic order analysis is performed for each feeder line linked to the respective load, and the amounts of all the generated harmonic currents up to the n-th order are then summed.

In this arrangement, however, the number of analyzers corresponding to the number of feeder lines are needed, or alternatively, when only a single analyzer is available, it has to be repeatedly used for each of the feeder lines, one after another. Furthermore, a determination process of whether the nth harmonic current is an outgoing or incoming one has to be performed on a feeder by feeder basis.

SUMMARY OF THE INVENTION

Accordingly, it is an object of the present invention to provide an outgoing harmonic level evaluator which evaluates the outgoing level of the harmonic currents by computing correction the amount of generated harmonics at receiving points, without the need for summing the measurement values of the generated harmonics in load bus lines.

In one aspect of the present invention, the outgoing harmonic level evaluator for evaluating the magnitudes of harmonic currents flowing out into a power supply system from a group of loads, comprises a potential current transformer and a potential transformer arranged at a receiving point from the power supply system, respectively for measuring a load current and a load voltage, a harmonic order analyzing unit for determining a harmonic current and a harmonic voltage on an order by order basis based on a current signal and a voltage signal, respectively, from the potential current transformer and the potential transformer, an incoming harmonic level correction computing unit for determining the corrected component of incoming harmonic currents based on the harmonic voltage and an impedance of a phase advancing capacitor block as a load, and a generated harmonic level evaluating unit for determining a true harmonic level generated from the group of loads through vector subtraction process of the harmonic current from the harmonic order analyzing unit and the corrected component of the incoming harmonic currents from the incoming harmonic level correction computing unit.

In the other aspect of the present invention, the outgoing harmonic level evaluator for evaluating the magnitudes of harmonic currents flowing out into a power supply system from a group of loads, comprises a potential current transformer and a potential transformer arranged at a receiving point from the power supply system, respectively for measuring a load current and a load voltage, a harmonic order analyzing unit for determining a harmonic current and a harmonic voltage on an order by order basis based on a current signal and a voltage signal, respectively from the potential current transformer and the potential transformer, a generated harmonic level correction computing unit for determining a division ratio of currents from the impedance of the power supply system and the impedance of a phase advancing capacitor block as a load, and a generated harmonic level evaluating unit for determining a true harmonic level generated from the group of loads based on the outgoing component of the harmonic currents from the harmonic order analyzing unit and the division ratio of currents from the generated harmonic level correction computing unit.

DESCRIPTION OF THE PREFERRED EMBODIMENTS

First Embodiment

Figure 1:
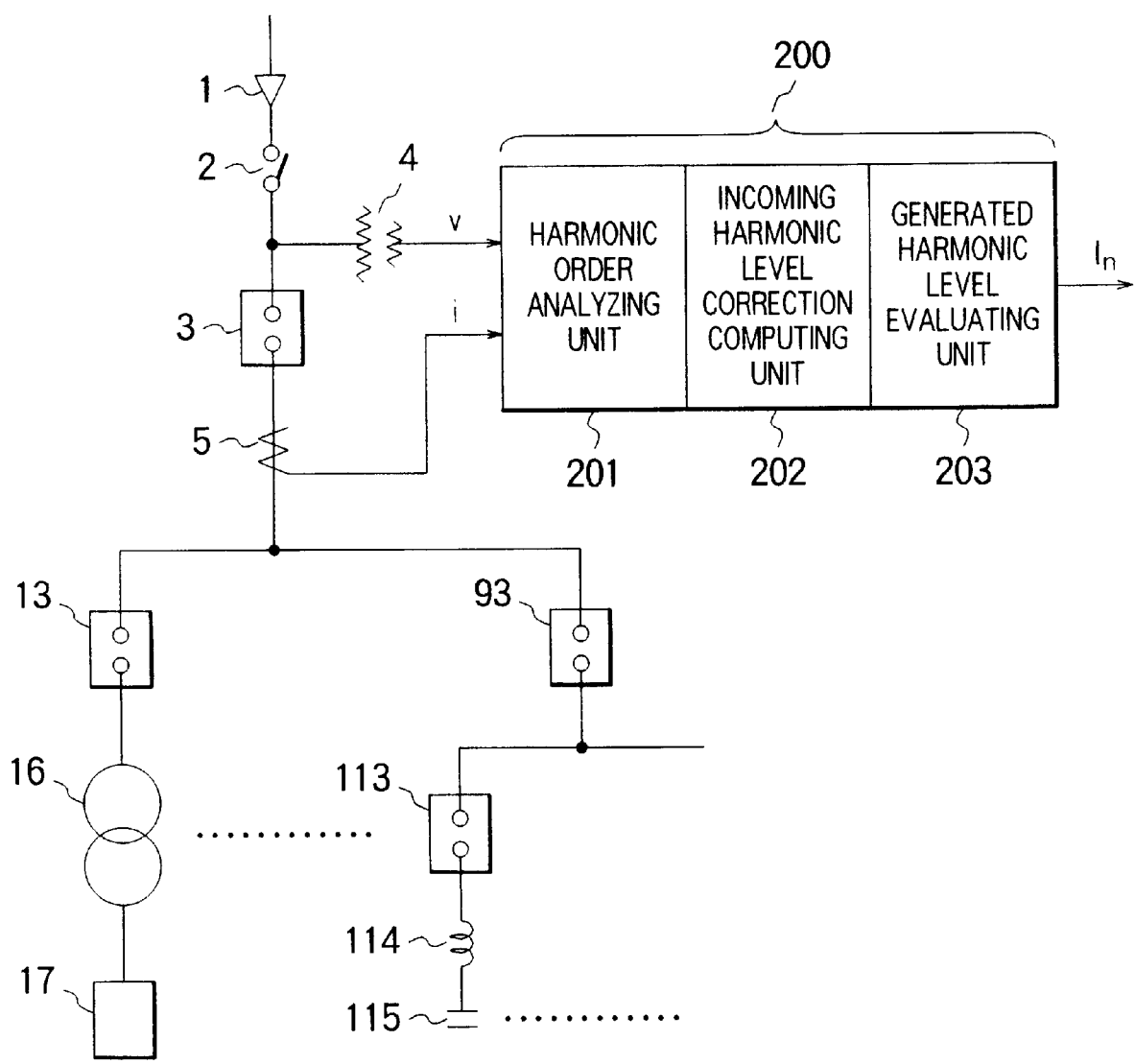
FIG. 1 is a block diagram showing an outgoing harmonic level evaluator according to a first embodiment of the present invention.

FIG. 1 is a block diagram showing the evaluator of the outgoing level of harmonic currents according to a first embodiment of the present invention.

Reference numerals 1 through 115 in FIG. 1 are equivalent to those described with reference to FIG. 3, and some of them having an identical arrangement are omitted in FIG. 1.

Shown in FIG. 1 are a terminal section 1 of a power cable that leads a three-phase, 50 Hz, 6.6 kV power into a power room in a building, a disconnector 2, a main circuit-breaker 3, and a potential transformer 4 and a potential current transformer 5 for conducting a voltage and a current at receiving points to respective measuring instruments. Also shown are a branch circuit-breaker 13, and a transformer 16 of a lighting power system or a motor driving power system for feeding power to a load 17.

Further shown are a branch circuit breaker 93 arranged in a phase advancing capacitor block, and a vacuum electro-magnetic contactor 113 for engaging or disengaging a phase advancing capacitor 115 and a serial reactor 114 in or out of a 6.6 kV line.

An outgoing harmonic level evaluator 200 of the first embodiment comprises a harmonic order analyzing unit 201, an incoming harmonic level correction computing unit 202, and a generated harmonic level evaluating unit 203.

In case of a three-phase three-wire system, the harmonic order analyzing unit 201 receives, as inputs, at a receiving point in a building, for example, two secondary current components $i_R$ and $i_T$ for phase R and phase T from the potential current transformer 5 for a instrument that measures a total load current for the entire building, along with two secondary components $V_{RS}$ and $V_{TS}$ from the potential transformer 4.

The harmonic order analyzing unit 201, known in the art, determines the magnitudes of harmonic currents and voltages and the directions of the harmonic incoming and outgoing through frequency analysis and phase determination processes, based on these currents i and voltages V. In the first embodiment, the harmonic order analyzing unit 201 performs harmonic order analyzing on an order by order basis to determine $I_{n1}$ and $V_n$ as vector signals of harmonic currents and harmonic voltages.

The harmonic order analyzing unit 201 outputs vector signals $I_{n1}$ of the harmonic currents as a first term vector signal to the generated harmonic level evaluating unit 203 while outputting the vector signal $V_n$ of the harmonic voltages to the incoming harmonic level correction computing unit 202. The letter n of $I_{n1}$ represents the order of the harmonics, and the positive sign and negative sign represent an incoming harmonic and outgoing (generated) harmonic, respectively.

The incoming harmonic level correction computing unit 202 receives the vector signal $V_n$ of the harmonic voltages from the harmonic order analyzing unit 201, and determines an incoming correction component $I_{n2}$ of the vector signal of the harmonic currents based on the harmonic voltage signal $V_n$ and an impedance value $Z_n$ of a phase advancing block beforehand set in an unshown built-in impedance setting section.

The incoming correction component $I_{n2}$ is output as a second term vector signal to the generated harmonic level evaluating unit 203. The incoming correction component $I_{n2}$ is expressed by equation (2), and the impedance value $Z_n$ is expressed by equation (3).

$$I_{n2}=V_n/Z_n \tag{2}$$

$$Z_n=(X_C/jn)+jn\, X_L \tag{3}$$

In equation (3), $X_C$ and $X_L$ are impedance values of the capacitor and reactor, respectively, at-the time of measurements.

In response to the reception of the vector signal $\pm I_{n1}$ of the harmonic currents from the harmonic order analyzing unit 201 and the incoming correction component $I_{n2}$ of the vector signal of the harmonic currents from the incoming harmonic level correction computing unit 202, the generated harmonic level evaluating unit 203 performs vector subtraction process as expressed in equation (4).

$$I_n=I_{n1}-I_{n2} \tag{4}$$

The physical meaning of this computation is that the generated harmonic level evaluating unit 203 determines a true amount of harmonic currents In generated in the load group in the building by computing the difference between the apparent harmonic currents $\pm I_{n1}$ measured at the receiving point and the harmonic current $I_{n2}$ flowing into the phase advancing block from the power supply side.

According to the first embodiment of the present invention, the outgoing harmonic level evaluator 200 with a function of evaluating a true amount of generated harmonics is organized by combining the means for computing an incoming harmonic current from the power supply side with the means that performs the prior art measurement of the generated harmonics. By placing the outgoing harmonic level evaluator 200 at the receiving point, a high accuracy evaluation of harmonic generation is quickly and easily performed without the need for a number of harmonic analyzers.

Second Embodiment

Figure 2:
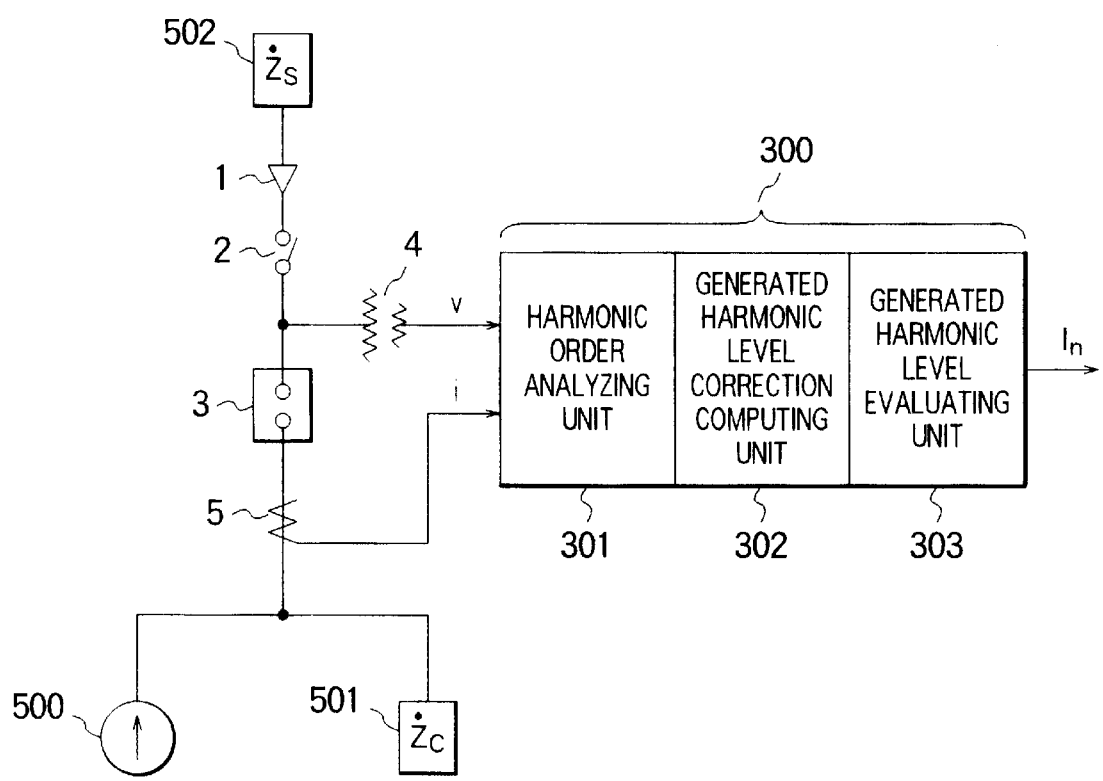
FIG. 2 is a block diagram showing an outgoing harmonic level evaluator according to a second embodiment of the present invention.

FIG. 2 is a block diagram showing the evaluator of the outgoing level of harmonic currents according to a second embodiment of the present invention.

In the second embodiment, the measurements of the generated harmonics level are made at the receiving point as in the first embodiment, but with the feeder circuit-breaker 93 in the phase advancing capacitor block being temporarily opened.

Figure 3:
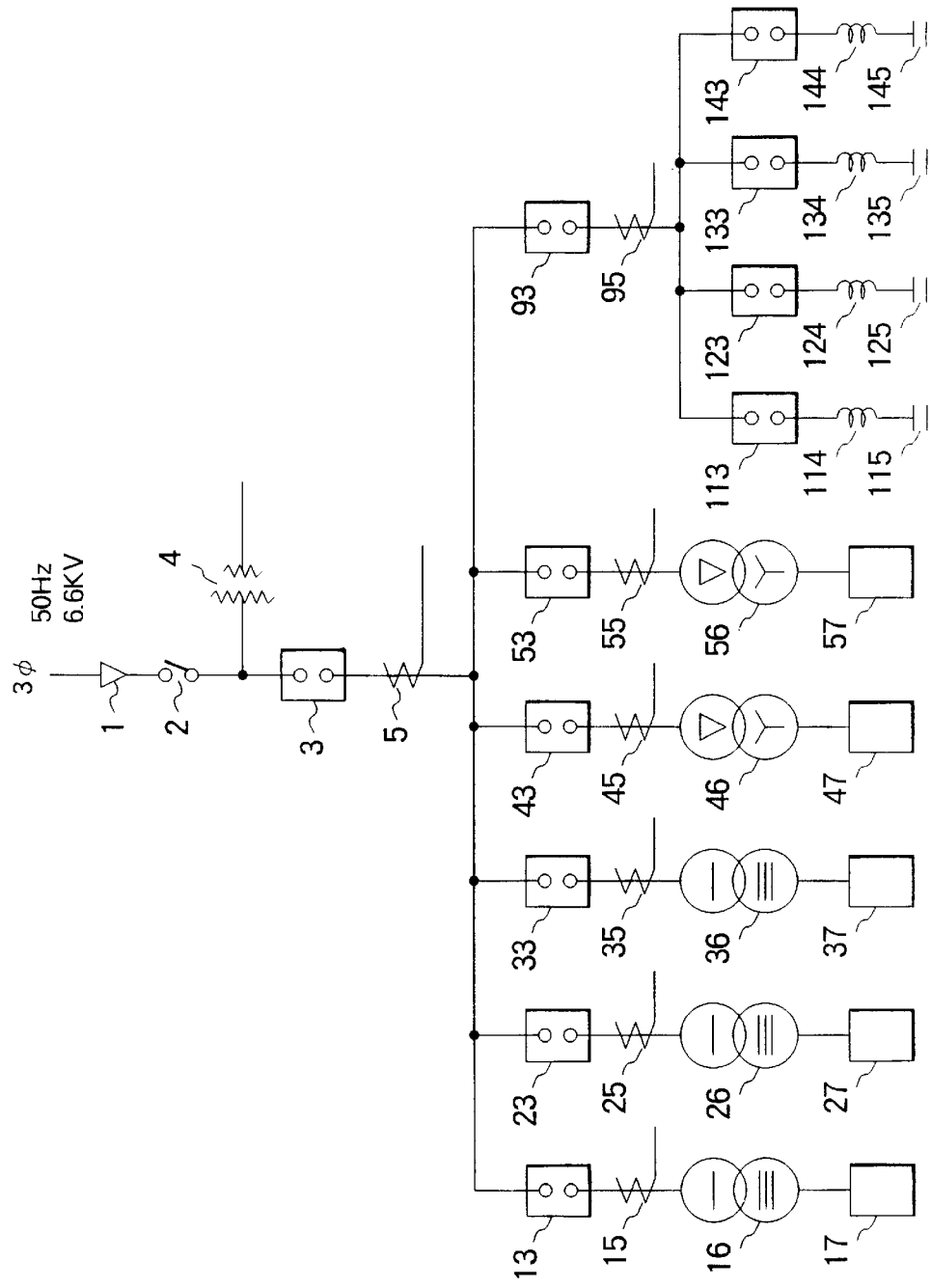
FIG. 3 is a block diagram showing a prior art outgoing harmonic level evaluator.

FIG. 2 is partly equivalent to FIGS. 1 and 3. Shown in FIG. 2 are a harmonic current source 500 generating harmonics in the feeder line, an impedance $Z_C$ 501 (vector component) in the phase advancing capacitor, and an impedance $Z_S$ 502 (vector component) of the power supply system. An outgoing harmonic level evaluator 300 in the second embodiment comprises, besides a harmonic order analyzing unit 301 known in the art and equivalent to the one in the first embodiment, a generated harmonic level correction computing unit 302 and a generated harmonic level evaluating unit 303.

The harmonic order analyzing unit 301 outputs, to a channel 1 of the generated harmonic level evaluating unit 303, an outgoing (generated) component $I_{n3}$ of harmonic currents, based on a current signal and a voltage signal from the potential transformer 4 and the potential current transformer 5, respectively.

The harmonic generation correction computing unit 302 has a setting section for the impedance $Z_S$ (vector component) 502 of the power supply system and the impedance $Z_C$ (vector component) 501 of phase advancing capacitor block, and a current division ratio α determined from these two impedances as expressed by equation (5) is input to a channel 2 of the harmonic generation evaluating unit 303.

$$\alpha = Z_C/(Z_S + Z_C) \quad (5)$$

The generated harmonic level evaluating unit 303 receives $I_{n3}$ and α at its-two respective input channels, and computes a true n-th order harmonic current $I_n$ flowing out of the building or the like from equation (6) and then outputs it.

$$I_n = I_{n3} \cdot \alpha \quad (6)$$

According to the second embodiment, the outgoing harmonic level evaluator comprises in combination the means for measuring the harmonic currents at the receiving point of the building or the like with the phase advancing capacitor block temporarily disengaged and the means which corrects the amount of generated harmonics according to the current division ratio determined by the impedance of the power supply side and the impedance of the phase advancing capacitor side.

The outgoing harmonic level evaluator arranged at the receiving point thus evaluates the true amount of the generated harmonic currents that flows out of the building into the external power supply side in the same way as the first embodiment does. The second embodiment also presents the same advantage as the first embodiment.

According to the present invention, the outgoing harmonic level evaluator for evaluating the magnitudes of harmonic currents flowing out into the power supply system from the group of loads, comprises the potential current transformer and the potential transformer arranged at the receiving point from the power supply system, respectively for measuring the load current and the load voltage, the harmonic order analyzing unit for determining the harmonic current and the harmonic voltage on an order by order basis based on the current signal and the voltage signal, respectively, from the potential current transformer and the potential transformer, the incoming harmonic level correction computing unit for determining the corrected component of incoming harmonic currents based on the harmonic voltage and the impedance of the phase advancing capacitor block as a load, and the generated harmonic level evaluating unit for determining the true harmonic level generated from the group of loads through vector subtraction process of the harmonic current from the harmonic order analyzing unit and the corrected component of the incoming harmonic currents from the incoming harmonic level correction computing unit.

In the prior art, when the total amount of generated harmonics is measured in an entire building, the harmonics of five to ten load bus systems, for example, have to measured simultaneously and then summed. According to the present invention, measurements at the receiving point only suffice to evaluate the total amount of the generated harmonics, and thus harmonic evaluation is quickly and easily performed without the need for a number of harmonic analyzers.

In the other aspect of the present invention, the outgoing harmonic level evaluator for evaluating the magnitudes of harmonic currents flowing out into the power supply system from the group of loads, comprises the potential current transformer and the potential transformer arranged at the receiving point from the power supply system, respectively for measuring the load current and the load voltage, the harmonic order analyzing unit for determining the harmonic current and the harmonic voltage on an order by order basis based on the current signal and the voltage signal, respectively from the potential current transformer and the potential transformer, the generated harmonic level correction computing unit for determining the division ratio of currents from the impedance of the power supply system and the impedance of the phase advancing capacitor block as a load, and the generated harmonic level evaluating unit for determining the true harmonic level generated from the group of loads based on the outgoing component of the harmonic currents from the harmonic order analyzing unit and the division ratio of currents from the generated harmonic level correction computing unit.

In this aspect of the present invention, measurements at the receiving point only equally suffice to evaluate the total amount of the generated harmonics, and thus harmonic evaluation is quickly and easily performed without the need for a number of harmonic analyzers.

What is claimed is:

1. An outgoing harmonic level evaluator for evaluating the magnitudes of harmonic currents flowing out into a power supply system from a group of loads, comprising:

a potential current transformer and a potential transformer arranged at a receiving point from the power supply system, respectively for measuring a load current and a load voltage;

a harmonic order analyzing unit for determining a harmonic current and a harmonic voltage on an order by order basis based on a current signal and a voltage signal, respectively, from said potential current transformer and said potential transformer;

an incoming harmonic level correction computing unit for determining the corrected component of incoming harmonic currents based on the harmonic voltage and an impedance of a phase advancing capacitor block as a load; and a generated harmonic level evaluating unit for determining a true harmonic level generated from the group of loads through vector subtraction process of the harmonic current from said harmonic order analyzing unit and the corrected component of the incoming harmonic currents from said incoming harmonic level correction computing unit.

2. An outgoing harmonic level evaluator for evaluating the magnitudes of harmonic currents flowing out into a power supply system from a group of loads, comprising:

a potential current transformer and a potential transformer arranged at a receiving point from the power supply system, respectively for measuring a load current and a load voltage:

a harmonic order analyzing unit for determining a harmonic current and a harmonic voltage on an order by order basis based on a current signal and a voltage signal, respectively from said potential current transformer and said potential transformer;

a generated harmonic level correction computing unit for determining a division ratio of currents from the impedance of the power supply system and the impedance of a phase advancing capacitor block as a load; and a generated harmonic level evaluating unit for determining a true harmonic level generated from the group of loads based on the outgoing component of the harmonic currents from said harmonic order analyzing unit and the division ratio of currents from said generated harmonic level correction computing unit.

* * * * *